(12) United States Patent
Gaku et al.

(10) Patent No.: US 6,229,096 B1
(45) Date of Patent: May 8, 2001

(54) NONWOVEN REINFORCEMENT FOR PRINTED WIRING BASE BOARD AND PROCESS FOR PRODUCING THE SAME

(75) Inventors: Morio Gaku; Mitsuru Nozaki, both of Tokyo; Kenji Saimen, Hyogo-ken; Tamemaru Esaki, Kyoto, all of (JP)

(73) Assignees: Mitsubishi Gas Chemical Company, Inc., Tokyo; Kuraray Co., Ltd., Kurashiki, both of (JP)

( * ) Notice: Subject to any disclaimer, the term of this patent is extended or adjusted under 35 U.S.C. 154(b) by 0 days.

(21) Appl. No.: 09/166,578

(22) Filed: Oct. 6, 1998

(30) Foreign Application Priority Data

Oct. 7, 1997 (JP) ................................... 9-290310

(51) Int. Cl.$^7$ ...................................... H05K 1/09
(52) U.S. Cl. ........................... 174/258; 428/137; 442/117
(58) Field of Search ............................. 442/76, 103, 110, 442/117; 428/137; 174/258, 259, 256

(56) References Cited

U.S. PATENT DOCUMENTS

| | | | |
|---|---|---|---|
| 4,140,831 | * 2/1979 | Miller | 428/285 |
| 5,286,330 | * 2/1994 | Azuma et al. | 156/323 |
| 5,415,738 | 5/1995 | Mehta et al. | |
| 5,549,777 | * 8/1996 | Langdon et al. | 156/244.18 |
| 5,631,073 | * 5/1997 | Riedel et al. | 442/364 |
| 6,033,765 | * 3/2000 | Takahashi et al. | 428/209 |

FOREIGN PATENT DOCUMENTS

| | | |
|---|---|---|
| 0 352 888 | 1/1990 | (EP) . |
| 0 594 892 | 5/1994 | (EP) . |
| 0 603 745 | 6/1994 | (EP) . |
| 0 686 726 | 12/1995 | (EP) . |
| 8-170295 | 7/1996 | (JP) . |
| WO 93/13940 | 7/1993 | (WO) . |

* cited by examiner

Primary Examiner—Jeffrey Gaffin
Assistant Examiner—Kamand Cuneo
(74) Attorney, Agent, or Firm—Oblon, Spivak, McClelland, Maier & Neustadt, P.C.

(57) ABSTRACT

There are disclosed a nonwoven reinforcement for a printed wiring base board which nonwoven reinforcement contains a wet system nonwoven fabric constituted of thermotropic cystalline polyester fiber having a melting point of 290° C. or higher (component A) and a thermotropic cystalline polyester binder which has a melting point of 290° C. or higher and is in the form of a film having holes including at least 5 holes/mm$^2$ each with an area of opening of 400 to 1000 $\mu$m$^2$ (component B), the component A being fixed by the component B; a process for producing the above nonwoven reinforcement; a printed wiring base board produced from the above nonwoven reinforcement; and a printed wiring board produced from the above printed wiring base board. The nonwoven reinforcement and the printed wiring (base) board are excellent in various performances such as uniformity, dimensional stability, heat resistance and electrical characteristics such as dielectric constasnt and dielectric loss tangent.

9 Claims, 1 Drawing Sheet

NONWOVEN REINFORCEMENT FOR PRINTED WIRING BASE BOARD AND PROCESS FOR PRODUCING THE SAME

BACKGROUND OF THE INVENTION

1. Field of the Invention

The present invention relates to a nonwoven reinforcement for a printed wiring base board, a process for producing the same, a printed wiring base board and a printed wiring board.

2. Description of the Related Arts

Glass fiber fabrics have been used over the past years as a nonwoven reinforcement for a printed wiring base board, but said fabrics suffer from the disadvantages of high dielectric constant and high specific gravity. In recent years, investigations have been made on aramid fiber fabrics in the form of liquid crystal, which, however, fail to meet the requirements of a printed wiring base board in electrical insulation properties because of high hygroscopicity.

In such circumstances, there is proposed the use of thermotropic crystalline polyester fiber which is low in dielectric constant, specific gravity and hygroscopicity as a nonwoven reinforcement for a printed wiring base board. For example, there is described a printed wiring base board using woven fabrics comprising thermotropic crystalline polyester fiber as a reinforcement in Japanese Patent Application Laid-Open No. 36892/1987 (Sho-62). However, in the case of producing a thin fabric of thermotropic crystalline polyester fiber, such problems as its low processability, a high manufacturing cost, inferior uniformity of the resultant nonwoven reinforcement and low handling properties such as resin impregnation properties occur.

There is also proposed the use of, as a nonwoven reinforcement, dry system nonwoven fabrics that are obtained by spun lace method (water-jet entangling method). Nevertheless said nonwoven fabrics fail to suffice the requirement of a nonwoven reinforcement for a printed wiring base board by reason of their poor mechanical performance, low uniformity and evils such as unevenness in thickness which is further enlarged as the a fabric is made thin.

In contrast to the foregoing, wet system nonwoven fabrics (fabrics by sheet-making process) have not only excellent mechanical performance but also high uniformity and besides can be made into nonwoven fabrics free from unevenness even for a thin sheet. For instance, there is proposed paper composed of thermotropic crystalline polyester short fiber and thermotropic crystalline polyester pulp in Japanese Patent Application Laid-Open Nos.47818/1995 (Hei-7) and 170295/1996 (Hei-8).

However, with any of the previous conventional methods it has been far from possible to obtain a nonwoven reinforcement for a printed wiring base board which is excellent in various performances such as uniformity resin impregnation properties, mechanical performance and heat resistance.

In general, heat calendering is carried out in order to enhance the mechanical performance and uniformity of nonwoven fabrics. Nevertheless, the practice of the aforesaid method has caused such a problem that the surfaces of the nonwoven fabric are pressed into the form of film, the pores that are capable of being impregnated with a resin are micronized and also the number of said pores are remarkably decreased, thereby making it difficult to impregnate the nonwoven fabric in whole (deterioration of the resin impregnation properties) and consequently forming a portion where the resin is not impregnated into the nonwoven fabric inside. The portion which is non-impregnated with a resin (air), when present to a large extent, brings about at the time of moisture absorption, unstable electrical insulation properties, inferior heat resistance of a solder and an unfavorable nonwoven reinforcement which is required for advanced performances for a printed wiring base board. Notwithstanding the foregoing, unless a heating pressurizing treatment is carried out, it is impossible to maintain the strength which is endurable to the production process such as resin impregnation step and in addition, a problem arises in dimensional stability.

Although an investigation is made on the production of a printed wiring base board with a fiber-reinforced resin by mixing reinforcing fiber in a resin, the reinforcing fiber is difficult to uniformly disperse in a resin. In addition, the reinforcement effect is restricted by the fiber oriented in random directions.

SUMMARY OF THE INVENTION

The object of the invention is to provide a nonwoven reinforcement excellent in various performances such as uniformity, resin impregnation properties, mechanical performance, heat resistance for use in a printed wiring base board; an efficient production process of the nonwoven reinforcement; a printed wiring base board and a printed wiring board that are excellent in various performances.

Specifically, the invention relates to the following embodiments:

(1) A nonwoven reinforcement for a printed wiring base board which reinforcement comprises a wet system nonwoven fabric constituted of thermotropic crystalline polyester fiber having a melting point of 290° C. or higher (component A) and a thermotropic crystalline polyester binder which has a melting point of 290° C. or higher and is in the form of a film having holes including at least 5 holes/mm$^2$ each with an area of opening of 400 to 1000 $\mu$m$^2$ (component B), said component A being fixed by said component B.

(2) The nonwoven reinforcement for a printed wiring base board according to the item (1), wherein the ratio by weight of said thermotropic crystalline polyester fiber (component A) to said thermotropic crystalline polyester binder (component B) is in the range of 20:80 to 90:10.

(3) The nonwoven reinforcement for a printed wiring base board according to the item (1) or (2), wherein the void fraction in said reinforcement is at least 40% and the breaking length thereof is at least 0.6 km.

(4) The nonwoven reinforcement for a printed wiring base board according to the item (1) or (2), wherein the Metsuke (basis weight) of said reinforcement is in the range of 20 to 100 g/m$^2$.

(5) A process for producing a nonwoven reinforcement for a printed wiring base board which comprises the steps of producing by wet-system sheet making, paper stuff comprising thermotropic crystalline polyester fiber having a melting point of 290° C. or higher (component A) and a thermotropic crystalline polyester fibrous binder having a melting point lower than 290° C. (component B); heat treating the resultant paper stuff under non-pressurizing condition to melt and bring the component B into a form of film having holes including at least 5 holes/mm$^2$ each with an area of opening of 400 to 1000 $\mu$m$^2$ and to fix the component A; and subjecting the component B to solid-phase polymerization to bring the melting point thereof to 290° C. or higher.

(6) A printed wiring base board comprising at least one prepreg which is formed by impregnating or adhesively bonding the wet-system nonwoven fabric described in the item (1) or (2) with a thermoplastic resin or a thermosetting resin.

(7) A printed wiring board which comprises at least one printed wiring base board according to the item (6).

(8) A printed wiring board which comprises at least one printed wiring base board according to the item (6) and at least one copper layer that are laminated with one another.

DESCRIPTION OF THE PREFERRED EMBODIMENTS

The nonwoven reinforcement for a printed wiring base board according to the invention is characterized in that the thermotropic crystalline polyester fiber excellent in heat resistance (prical fiber A) and the interspace are firmly fixed by the specific binder, thereby making itself a nonwoven reinforcement excellent in various performances such as uniformity, heat resistance and resin impregnation properties by the use of such specific binder as a constitutional component.

Figure 1:
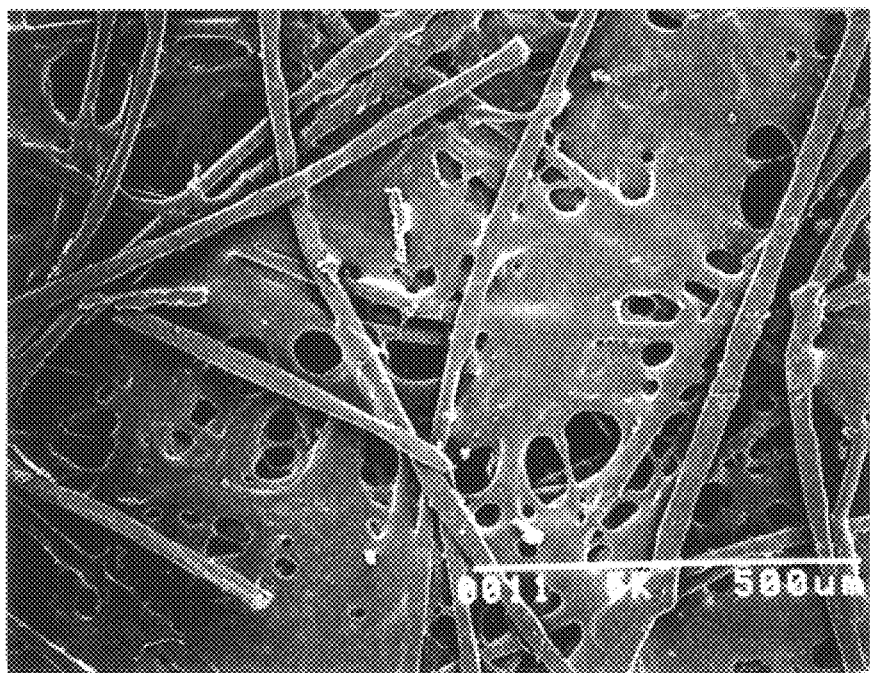
FIG. 1 is an electron photomicrograph showing surface state of a nonwoven reinforcement for a printed wiring base board as one example of the present invention.

The binder (component B), which is a constituent of the nonwoven reinforcement of the invention and is in the form of film having specific holes formed therein, yields a nonwoven reinforcement excellent in resin impregnation properties, uniformity and mechanical performance (refer to FIG. 1).

It is necessary that the binder in the form of film be provided with holes each having an area of opening of 400 to 10000 $\mu m^2$ in numbers of at least 2/mm$^2$, preferably 10 to 200/mm$^2$, more preferably 40 to 150/mm$^2$. Unreasonably small holes or less number of holes lead to insufficiency in resin impregnation properties, whereas unreasonably large holes result in failure to form a desirable nonwoven reinforcement, since the principal fiber and interspace are not firmly fixed. From the viewpoint of resin impregnation properties and mechanical performance, the average area of opening is preferably 1000 to 5000 $\mu m^2$, more preferably 1000 to 4000 $\mu m^2$. From the standpoint of resin impregnation properties, the holes are preferably non-angular, namely are preferably in the form of circle or ellipse. The holes that are formed in the binder in the form of film as mentioned herein should be clearly distinguished from the voids that are formed among the principal fiber substantially free from the binder. The area of opening of the hole can be obtained by taking magnified photographs (e.g. a magnification of about 100×) of the surface of the wet system nonwoven fabric (base material), and determining the area from the magnified photographs. The aforesaid area of opening is an area of the portion which enables the underlying layer to be so judged as being free from the principal fiber or the like.

Also from the aspect of resin impregnation properties and mechanical performance, the area of the holes that are made in the binder in the form of film on the surface of the nonwoven reinforcement occupies preferably at least 5%, more preferably 10 to 50%, particularly preferably 10 to 20% based on the area of the binder. In addition, the area of the portion which is so judged that the principal fiber is present on the surface layer of the surface of the nonwoven reinforcement, occupies preferably at least 5%, more preferably 10 to 50%, particularly preferably 20 to 40%.

Preferably, the resin impregnation properties of the nonwoven reinforcement of the invention are substantially marked with 0 (zero). Said resin impregnation properties are evaluated by the method as described in the working examples of the present invention.

It is indispensable that the components A (principal component) and B (film-form binder component) have each a melting point of at least 290° C. Any of the components constituting the nonwoven reinforcement, when having an unreasonably low melting point, causes insufficiency in heat resistance and heat-resistant dimensional stability, thus raising a problem in a production step for the formation of a printed wiring board.

In spite of a material having a relatively low melting point being usually used as a binder, the nonwoven reinforcement of the invention is characterized in that both the principal component and the binder have each a high melting point of at least 290° C., that is, high heat-resistance. As highly heat-resistant binder firmly fixes the principal fiber and its interspace, there is obtainable the nonwoven reinforcement excellent in various performances including mechanical performance, dimensional stability, and heat resistance. Moreover, the melting points of the principal fiber (component A) and the film binder (component B) are at least 290° C., preferably at least 300° C. from the viewpoint of heat resistance, and further is at most 390° C., preferably at most 350° C. from the aspect of production process.

The dry thermal shrinkage of the nonwoven reinforcement is 3% or less, preferably 0 to 2.5%, more preferably 0 to 2%.

The melting point of the thermotropic crystalline polyester fiber (MP) as mentioned in the invention is the peak temperature of major heat absorption peak which is observed by differential scanning calorimeter (DSC) according to JIS K7121 for the thermotropic crystalline polyester constituting the fiber. Specifically, said melting point is obtained by a method in which 10 to 20 mg of a polyester sample placed in an aluminum-made pan is enclosed in a DSC (e.g. produced by Mettler Corp. under the trade name "TA-3000"), subsequently a nitrogen carrier gas is passed through the DSC at a flow rate of 100 ml/minute with temperature raising at a rate of 20° C./minute, and the peak temperature of major heat absorption is determined. In the case where distinct heat-absorption peak does not appear in said first run depending upon the type of the polymer, there is preferably available a method comprising raising the temperature to a temperature higher than the expected one by about 50° C. at a rate of 50° C./minute; completely melting the sample at said temperature for 3 minutes; cooling to 50° C. at a rate of 80° C./minute; and thereafter measuring a heat-absorption peak at a temperature raising rate of 20° C./minute.

The breaking length of the nonwoven reinforcement of the invention is at least 0,6 kgm preferably at least 1.0 km from the standpoint of process stability and dimensional stability, and its upper limit is not limited. However the upper limit is preferably at most 10 km taking manufacturing cost, etc. into consideration. Further the void fraction is preferably at least 40% from the aspect of resin impregnation properties, and is preferably in the range of 45 to 70% from the aspect of resin impregnation properties, mechanical performance and the like.

Since the nonwoven reinforcement for a printed wiring base board is called upon to be thin, the thickness thereof is preferably 20 to 200 μm, more preferably 25 to 100 μm. The basis weight (Metsuke) is preferably 20 to 100 g/m$^2$, more preferably 25 to 50 g/m$^2$ from the viewpoint of mechanical performance and resin impregnation properties. The standard deviation of Metsuke is preferably 0.7 to 1.1 from the standpoint of uniformity.

Figure 2:
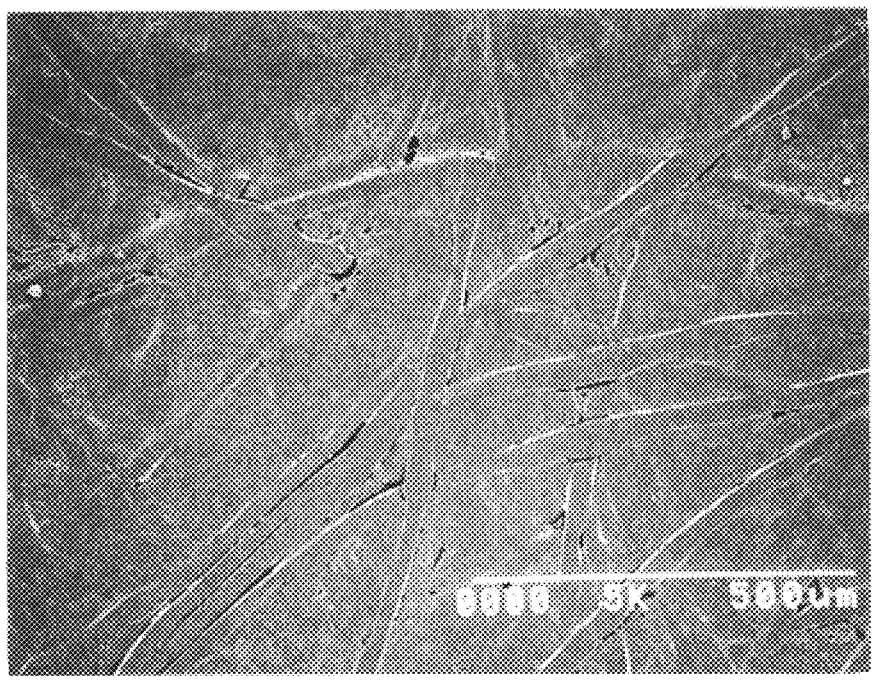
FIG. 2 is an electron photomicrograph showing the surface state of a nonwoven reinforcement for a printed wiring base board which reinforcement has been subjected to a heat calendering treatment.

The process for producing the nonwoven reinforcement of the invention is not specifically limited, but it can not be produced by the conventional process of heating calendering at a high temperature and high pressure. A nonwoven reinforcement having a surface in the form of film is obtained by said conventional process, but the prescribed holes according to the invention are not formed thereby, with the result that resin impregnation properties of the nonwoven reinforcement are lowered (refer to FIG. 2).

A preferable process for producing the nonwoven reinforcement for a printed wiring base board according to the invention is exemplified by a process which comprises the steps of producing by wet-system sheet making, paper stuff comprising thermotropic crystalline polyester fiber having a melting point of 290° C. or higher (component A) and a thermotropic crystalline polyester fibrous binder having a melting point lower than 290° C. (component B); heat treating the resultant paper stuff under nonpressurizing condition to melt and bring the component B into the form of film having holes including at least 5 holes/mm$^2$ each with an area of opening of 400 to 10000 μm$^2$ and to fix the component A; and subjecting the component B to solid-phase polymerization to bring the melting point thereof to 290° C. or higher.

It is necessary in the invention to employ thermotropic crystalline polyester fiber having a melting point of 290° C. or higher in combination with thermotropic crystalline polyester fibrous binder having a melting point lower than 290° C. There may be the possibility that the aforesaid fibrous binder fails to retain the original configuration of the nonwoven reinforcement at the time of melting due to shrinking. However, it is thought that the original configuration thereof is retained by the presence of the component A, and further that the component B, when melted in the coexistence of the components A and B, is made into the form of film and helps making the prescribed holes, thereby improving the resin impregnation properties. The single use of fiber having a melting point lower than 290° C. leads to insufficiency in mechanical performance and configuration retainability, whereas the single use of fiber having a melting point of 290° C. or higher results in nothing but a nonwoven reinforcement having inferior mechanical performance due to insufficient binder effect.

In general, it is difficult to firmly fix the principal fiber and the interspace by melting the binder component under a non-pressurized condition. The binder has preferably a low melting point from the aspect of binder effect, but the use of a binder having only a low melting point is a problem in that the heat resistance of a nonwoven reinforcement is made insufficient. On the contrary, the invention exhibits remarkable working effect due to the use of a specific binder comprising thermotropic crystalline polyester which exerts excellent binder effect at the time of sheet-making owing to its low melting point, which firmly fixes the the pricipal fiber and the interspace after the sheet-making because of its improved mechanical performance due to a heat treatment (solid-phase polymerization) and which manifests excellent heat resistance.

The thermotropic crystallizability (anisotropy) as mentioned herein means to manifest optical thermotropic crystallizability (anisotropy) in a melted phase, and is recognizable by placing a sample in question on a hot stage, heating it to raise the temperature in a nitrogen atmosphere, and observing the transmitted light through said sample.

The aromatic polyester to be used in the invention comprises a repeating constitutional unit such as an aromatic diol, an aromatic dicarboxylic acid, an aromatic hydroxycarboxylic acid, etc., and preferably, it comprises the combination of the unit as represented by the following chemical formulae 1 to 3: Needless to say, an other copolymerizable unit such as isophthalic acid unit may be incorporated at need to improve spinnability, but it is preferably in a small amount (e,g, at most 20 mol %) from the viewpoint of fiber performance.

[Chemical Formula 1]

(1)

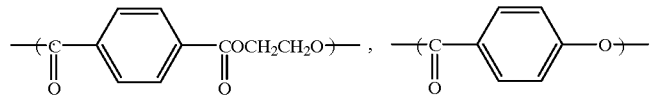

(2)

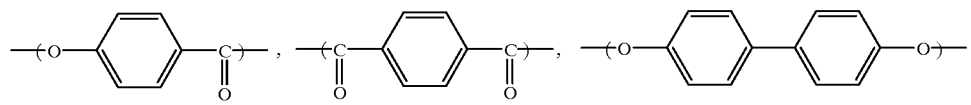

(3)

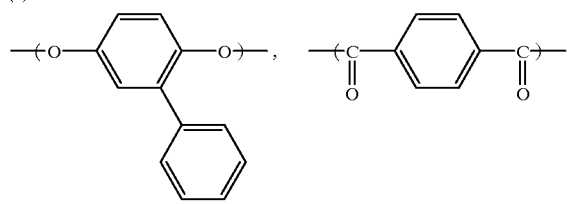

(4)
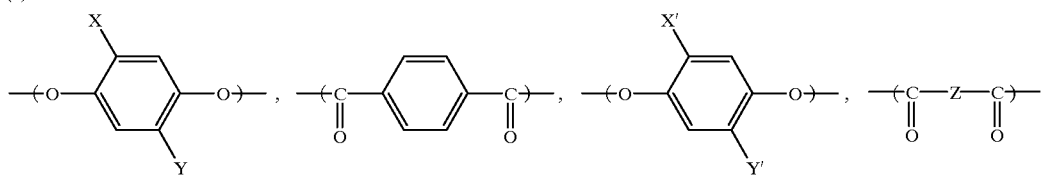
wherein X, X', Y and Y' are each H, Cl, Br or CH₃, and Z is
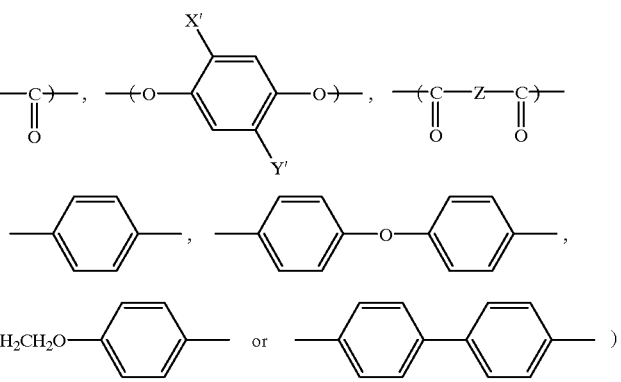
(5)
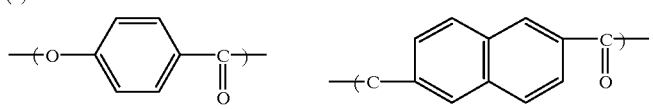
(6)
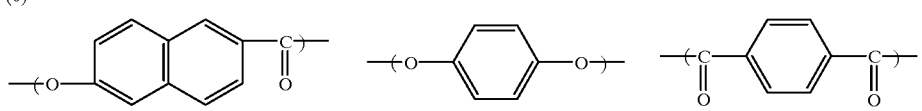
[Chemical Formula 2]
(7)
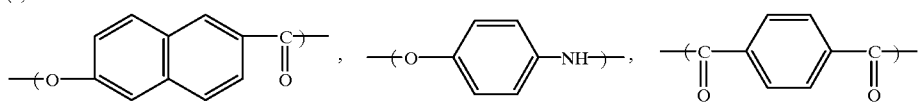
(8)
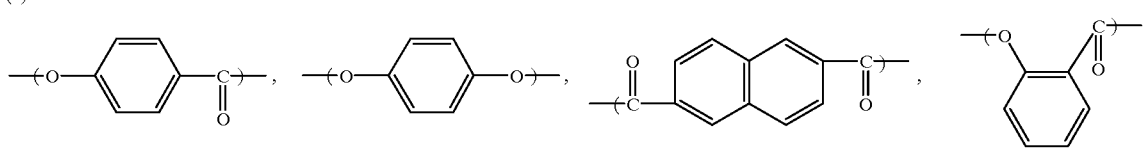
(9)
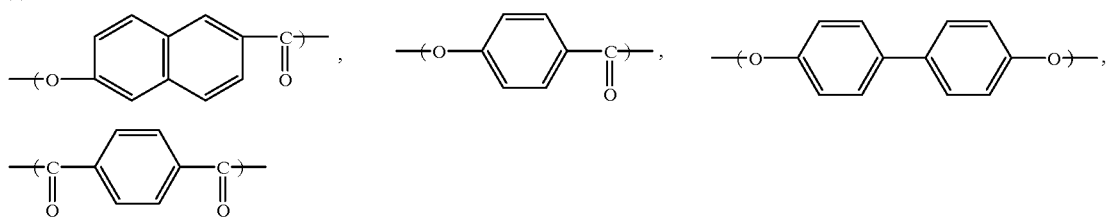
(10)
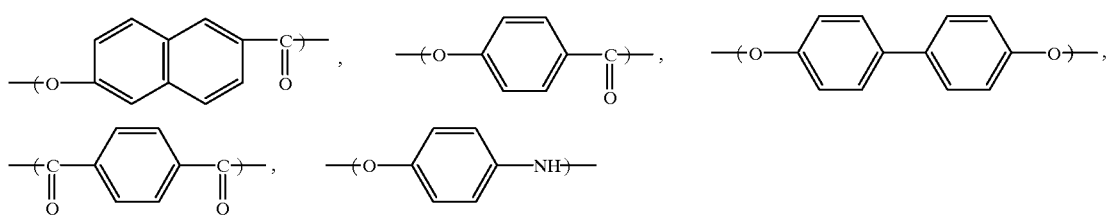
[Chemical Formula 3]
(11) 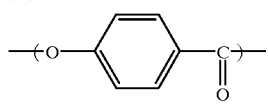   (P)   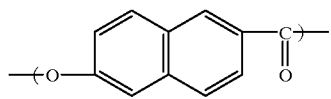   (Q)

(12)

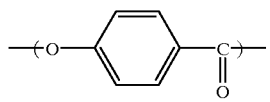

(T)

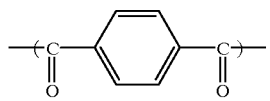

-continued (R)

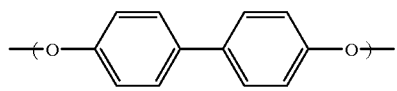

(S)

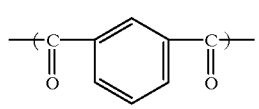

(U)

The aromatic polyester is preferably that comprising the combination of the repeating constitutional units represented by the chemical formula 3, more preferably that comprising at least 65 mol %, especially at least 80 mol % of moiety constituted of the repeating constitutional units (P) and (Q) in total. The aromatic polyester is particularly preferably that comprising 4 to 45 mol % of the unit (Q) based on the sum of the units (P) and (Q) from the aspect of spinnability and fiber performance.

The thermotropic crystalline polyester to be used in the invention may be incorporated with one or two or more polymers to the extent that the effect of the invention is not impaired, said polymer being exemplified by polyethylene terephthalate, a modified polyethylene terephthalate, a polyolefin, a polycarbonate, a polyarylate, a polyamide, a polyphenylene sulfide, a polyether ester ketone, a fluororesin and the like. The aforesaid polyester may be incorporated with one or two or more inoranic materials such as titanium oxide, kaoline, silica and barium oxide; carbon black; colorants such as dye and pigment; additives such as antioxidant, ultraviolet absorber, light stabilizer and the like. From the viewpoint of fiber performance, the content of the component other than the thermotropic crystalline polyester is preferably at most 50% by weight, more preferably at most 30% by weight, particularly preferably at most 10% by weight based on the weight of the fiber.

The melting point of the component A to be used in the invention is preferably 290° C. or higher, more preferably 300° C. or higher from the standpoint of heat resistance and dimensional stability of the nonwoven reinforcement and the hole formability for the binder; and is preferably 390° C. or lower, more preferably 350° C. or lower from the viewpoint of production process. Needless to say, at least two thermotropic crystalline polyesters may be used to form mixed fiber, or composite fiber or fiber-mixed fiber.

The heat resistant fiber is obtained by subjecting raw spun yarn obtained, for example, by spinning thermotropic crystalline polyester to solid-phase polymerization by a heat treatment. In the case of said polyester being melt spun, the molecular weight thereof substantially remains unchanged before and after spinning. The solid-phase polymerization by a heat treatment increases the degree of polymerization of the resultant fiber, markedly raises the melting point (heat resistance) and remarkably enhances the mechanical performance, whereby favorable principal fiber is obtained. Although the polymer constituting the raw spun yarn generally has a degree of polymerization of 80 to 120, the principal fiber (component A) of the invention is preferably composed of polymers having a degree of polymerization of 250 to 350.

The heat treatment condition is not specifically limited, but is preferably carried out in the temperature range of Tm−60° C. to Tm+20° C. based on the melting point of the polymer (Tm) constituting the fiber, and the heat treatment temperature is preferably raised consecutively from Tm−60° C. in particular. The heat may be supplied by a method utilizing heat radiation such as a heated plate and infrared heater, a method bringing into contact with a heated roller, a heated plate, etc., an internally heating method utilizing high frequency, etc., or the like method. the heat may be supplied under tension of fiber or without tension thereof.

The heat treatment atmosphere is not specifically limited, but may be an atmosphere of an inert gas such as nitrogen gas and carbon dioxide gas, or an atmosphere of an oxygen-containing active gas such as air or under reduced pressure. A dehumidified gas is preferably adopted, since fiber properties are deteriorated when water or moisture is contained therein at the time of the heat treatment.

More specific and preferable process for producing the heat resistant fiber is exemplified by a method comprising the steps of drying, at 140° C. under reduced pressure for 100 hours, thermotropic crystalline polyester which consists of p-hydroxybenzoic acid unit and 2-hydroxy-6-naphthoic acid unit at a molar ratio of 73:27 and has a melt viscosity of 430 poise, a degree of polymerization of about 100 and a melting point of about 280° C.; feeding the dried polymer to a vent-type single screw extruder; filtering it by passing through a filter layer having an average pore size of 5 μm and comprising a sand layer and metallic fiber; spinning out through a spinneret having 50 nozzle holes of 0.08 mm diameter at 320° C. to produce thermotropic crystalline polyester fiber having a melting point of 280° C.; heat treating the resulting fiber at 280 to 320° C. to proceed with solid-phase polymerization and to increase the degree of polymerization to about 300. The above-mentioned process enables smooth and efficient production of the fiber well suited as the principal fiber (component A).

The configuration of the component A may be the form of filament, cut fiber or beaten product without specific limitation, and the component A is preferably in the form of cut fiber which is obtained by cutting the fiber formed by spinning from the standpoint of sheet making properties, mechanical performance and resin impregnation properties, especially cut fiber having a diameter of 5 to 30 μm and a length of 2 to 20 mm from the standpoint of sheet making properties and tenacity. In the case of cut fiber being used, the heat treatment may be carried out before or after the cutting.

The component A has a fiber tenacity of preferably at least 16 g/d, more preferably at least 18 g/d, particularly preferably at least 20 g/d. The upper limit of the fiber tenacity is not specified, but is preferably at most 50 g/d from the aspect of production cost. In addition, the modulus of elasticity is preferably at least 400 g/d, more preferably 500 g/d to 2000 g/d.

It is necessary in the invention to blend a binder as the component B from the viewpoint of binder effect and hole formability, said binder having a melting point lower than 290° C., preferably 280° C. or lower, but preferably 260° C. or higher, especially 270° C. or higher from the aspect of heat resistance. Although a binder having a high melting point needs to be used to obtain highly heat-resistant nonwoven reinforcement, such a binder is less effective as a binder and is insufficient in viscosity decrease at the time of melting, thereby bringing about a problem that it is made difficult to form the holes that are suitable for resin impregnation. However, thermotropic crystalline polyester having a low melting point, when blended in a nonwoven reinforcement, enables to exert excellent binder effect of low melting point at the time of sheet making, to form holes that are suitable for resin impregnation due to sufficiently lowered viscosity, and to produce a nonwoven reinforcement excellent in various performances owing to the improvements in mechanical performance and heat resistance in the subsequent heat treatment (solid-phase polymerization). Examples of such binders having a melting point lower than 290° C. include raw spun yarn of thermotropic crystalline polyester obtained by a method same as that for the principal fiber A, that is, fiber without being heat treated (solid-phase polymerization) for melting point raising after melt spinning (including the raw spun yarn subjected to beating, grinding or the like).

It is necessary that the binder blended (component B) be fibrous. Blending of a resinous binder makes it difficult to uniformly disperse the principal fiber (component A) and the binder, to form an integrated film due to insufficiency in viscosity decrease upon melting and to make desirable holes. With such a binder just mentioned, it is impossible to obtain the nonwoven reinforcement for a printed wiring base board of the invention.

The binder, provided that it is fibrous, is not particularly limited in its specific configuration. It is preferably in the form of fine pulp from the aspect of sheet making properties and hole formability, more preferably fine pulp having a fiber diameter of 1 to 7 $\mu$m and a fiber length of about 0.1 to 3 mm from the viewpoint of sheet making properties, binder performance and hole formability, especially having a fiber diameter of smaller than 5 $\mu$m from the viewpoint of sheet making properties and hole formability. The binder in the form of fine pulp can exert further excellent effect, since it is enhanced in sheet making properties and binder performance and is easily integrated with one another into the form of film. By the same reason, the freeness (CSF; Canadian Standard Freeness) of the fibrous binder is preferably 600 ml or less, especially 550 ml or less and more than 0 (zero) ml.

The binder in the form of pulp can be produced by beating and grinding a molding such as thermotropic crystalline polyester fiber or film, preferably raw spun yarn by the use of a refiner; or by producing multi-component fiber such as islands-in-a-sea type fiber or composite fiber comprising crystalline polyester as one component, and then treating the resultant fiber with a solvent, an acid or an alkali before or after cutting the fiber to remove other components. The binder is more preferably the binder in the form of pulp obtained by beating and grinding cut fiber having about 5 denier. Needless to say, the binder may be mixed fiber, composite fiber and/or fiber-mixed fiber which is formed by using at least two types of crystalline polyester.

The fibrous binder blended in paper stuff (component B) is preferably such fiber as having a fiber tenacity in the range of about 5 to 15 g/d, or the fiber formed by beating and grinding said fiber. Both the fibers have preferably a modulus of elasticity in the range of about 200 to 600 g/d.

The blending ratio by weight of the component A to the component B is preferably in the range of 20:80 to 90:10 from the viewpoint of sheet making properties and mechanical performance, and is preferably in the range of 20:80 to 60:40 from the viewpoint of hole formability (resin impregnation properties). The blending ratio of the component B, when being unreasonably low, leads to deterioration of sheet making properties and sheet tenacity owing to decrease in adhesive strength among the principal fiber, thus making it difficult to form suitable holes for resin impregnation. That is to say, it is necessary in order to obtain the base material for a printed wiring base board according to the invention, that the viscosity of the component B be sufficiently lowered so that fibrous binder is integrated with one another to form a film and further, specific holes be formed. The blending ratio of the component B, when being unreasonably low, makes it impossible or difficult to form a film even if the component is melted, whereas the blending ratio of the component A, when being unreasonably low, leads to insufficient mechanical performance and dimensional stability, thus making it difficult to form specific holes.

The process for producing the nonwoven reinforcement of the invention is not specifically limited, but the following process is preferably applicable to the production of the same.

First of all, paper stuff which comprises at least heat resistant thermotropic crystalline polyester fiber (component A) and fibrous binder (component B) is subjected to wet-system sheet making process. The paper stuff may contain a component other than the component A or B to the extent that the effect of the invention is not impaired. In order to assure the effect of the invention, the total proportion by weight of both the components is preferably at least 50%, more preferably at least 80%, particularly preferably at least 90% based on the paper stuff. The paper stuff is dispersed in water (preferably at ordinary temperature) to form a slurry at a ratio by weight of the paper stuff to water of preferably 0.01 to 1.0.

The sheet-making machine to be employed is not particularly limited, but may be selected for use from the conventional known machines, which are specifically exemplified by circular net type wet system sheet-making machine, short net type wet system sheet-making machine, short-net inclined type wet system sheet-making machine, long net type wet system sheet-making machine, Yankee machine with wire, multi-cylinder type wet-system sheet-making machine and wet-system sheet-making machine equipped with a dryer of hot air system or radiation heat system. The resultant wet-system sheet product can be made into wet-system nonwoven fabric, but involves a problem regarding processability because of poor mechanical performance (breaking length being about 0.2 km or less) in spite of favorable resin impregnation properties due to a high void fraction being usually 60% or higher.

In view of the foregoing, the wet-system sheet product after drying is required to be heat treated under a non-pressurized condition, and accordingly is heat treated to melt the binder component, to make the component into a film product having at least 5 holes/mm$^2$ each having an area of opening of 400 to 10000 $\mu$m$^2$, and to fix the component A and the interspace. By making the component B into the film having specific holes, there is obtained a nonwoven reinforcement excellent in resin impregnation properties.

It is necessary during the aforesaid step to set the melting point of the component B on at least 290° C. by means of solid-phase polymerization. Unless the solid-phase polymerization is performed, the effect of the invention is not exhibited because of insufficient heat resistance of the nonwoven reinforcement itself and failure of firm bonding for the fiber as the component A.

It is necessary to carry out the heat treatment of the wet-system sheet product under substantially non-pressurized condition. The heat pressing (heat calendering) treatment which has heretofore been widely practiced, when applied to said sheet product, can not produce the objective nonwoven reinforcement because of markedly decreased resin impregnation properties in spite of enhanced paper tanacity.

By the term "non-pressurized condition" as mentioned herein is meant a condition under which substantially strong pressure is not applied to the wet-system sheet product. Under said "non-pressurized condition", a heat treatment method may be applied to the sheet product in any optional manner, and is exemplified by a method in which a wet-system sheet product is continuously heated by bringing one or both sides thereof into contact with a heated roller. In this case, a linear pressure of the roller applied onto the sheet product needs to be lowered, preferably to 0 to 10 kg/cm, approx. Needless to say, the above-mentioned contact heating system by using a heated roller may be replaced with a convection-heating system with hot air, etc. or a radiation-heating system with infrared rays, etc. or the combination of the above two or more.

Specific preferable heat treatment conditions, although depend upon the types of the principal fiber and the binder, the blending proportion and the like, include a heat treatment temperature of 200 to 400° C., preferably 260 to 350° C., and a heat treatment hour of 10 minutes to 48 hours, preferably 10 minutes to 40 hours.

The heat treatments for melting the binder and for solid-phase polymerization may be performed in a same step or in different steps. In particular, it is preferable to carry out melt adhesion of the binder component with a heated-roller treatment preferably at a heat treatment temperature in the range of Tm−10° C. to Tm+10° C. at a linear velocity of 5 to 30 m/minute, and thereafter to carry out solid-phase polymerization by hot-air treatment preferably at a heat treatment temperature in the range of Tm+10° C. to Tm+70° C. for a heat treatment hour in the range of 10 to 30 hours, wherein Tm is the melting point of the fibrous binder as the component B. By adopting appropriate conditions, it is made possible to efficiently produce the nonwoven reinforcement excellent in various performances such as resin impregnation properties and mechanical performance. In view of the production process, etc. it is preferable to treat and dry the wet system sheet product at a low temperature (e.g. 100 to 150° C.) and subsequently heat-treat to melt the binder component.

Since a printed wiring base board is called upon to be thin, the resultant wet system nonwoven fabric may be treated with a low-temperature pressing treatment to further decrease the thickness. The configuration of the nonwoven fabric is stabilized by the foregoing heat treatment, and therefore the fabric can be thinned without substantially impairing the resin impregnation properties even if the low-temperature pressing treatment is implemented. The temperature of the low-temperature pressing treatment is preferably in the range of 0 to 140° C., particularly preferably in the range of 0 to 100° C. The linear velocity is preferably at most 100 kg/cm, particularly preferably in the range of 1 to 50 kg/cm.

In the invention, the nonwoven fabric thus obtained may be subjected to a treatment such as a physical treatment and/or a chemical treatment to improve adhesion between said fabric and the resin and also to enhance the wettability due to the resin. The physical treatment is exemplified by corona discharge treatment, glow discharge treatment, plasma treatment, electron beam irradiation treatment and heat treatment in an oxygen-containing atmosphere. The chemical treatment is exemplified by sputter etching. Two or more treatments among them may be used in combination. In the case where the heat treatment for melting the binder and/or making solid-phase polymerization is implemented in an oxygen-containing atmosphere, it is made possible to remarkably enhance the adhesiveness and wettability to the resin even without newly effecting another treatment. In particular, in the case of carrying out heat treatment in an oxygen-containing atmosphere, and/or corona discharge treatment, the adhesiveness to the resin can preferably be enhanced. When the corona discharge treatment is performed, it is preferably performed under the condition of 0.5 to 3 kW in order to suppress activation effect and the carbonization of fiber.

The heat treatment, when being carried out in an oxygen-containing atmosphere, causes the fiber surface to be oxidized to form a polar group such as carboxyl group on the surface thereof, thus enhancing the adhesiveness and wettability to the resin. It is preferable to carry out the heat treatment at 200 to 400° C. for one minute or longer, particularly at 300 to 400° C. for one minute or longer, and from the aspect of production process, for 30 hours or shorter. The heat treatments for melting the binder and/or for solid-phase polymerization may be performed in a same step or in differet steps, respectively.

The nonwoven reinforcement for a printed wiring base board of the invention can be distributed and merchandised as such. Alternatively, the nonwoven reinforcement may be made into a printed wiring base board by impregnating said nonwoven reinforcement with a thermosetting resin and/or a thermoplastic resin (matrix resin), or adhesively bonding said resin or resins to the base material to produce a prepreg, and then producing the base board using single layer of the prepreg or a plurality of the prepregs in the form of a laminate.

Preferable examples of the matrix resin include at least one thermosetting resin selected from the group consisting of phenolic resin, epoxy resin, unsaturated polyester resin, cyanate resin, maleimide resin and polyimide resin; the aforecited at least one thermosetting resin which is modified by adding polyvinyl butyral, acrylonitrole/butadiene rubber, multi-functional acrylate component or the like; and a thermosetting resin which is modified with a thermoplastic resin (IPM type or semi-IPM type polymer alloy) such as crosslinked polyethylene, bismaleimide/triazine base resin, crosslinked polyethylene-modified epoxy resin, crosslinked polyethylene-modified cyanate resin or polyphenylene ether-modified cyanate resin.

Of these are preferable epoxy resin, polyimide resin, unsaturated polyester resin, cyanate resin, etc. as a matrix resin for a printed wiring base board. In the case of using the fiber comprising thermotropic crystalline polyester consisting essentially of p-hydroxybenzoic acid unit and 2-hydroxy-6-naphthoic acid unit as the fiber which constitutes the nonwoven reinforcement, there is preferably used, as the matrix resin, bismaleimide/triazine base resin which is excellent in adhesiveness to said fiber, insulating properties and heat resistance.

The content of the matrix resin in said prepreg is not specifically limited, but is in the range of 30 to 95% by weight, preferably 40 to 80% by weight based on the whole amount of said prepreg from the viewpoint of suppression of interlaminar peeling and defective molding; mechanical performance, dimensional stability and thermal stability of the laminated nonwoven reinforcement; and the like factors.

The method for impregnating and imparting the resin is not specifically limited, but may be selected for use from conventional known methods that are exemplified by impregnation method, coating method and transfer method, more specifically, a method in which the nonwoven reinforcement is impregnated with a varnish prepared by dissolving a matrix resin in a solvent, and then is dried; a method in which the nonwoven reinforcement is impregnated with a liquid matrix resin under ordinary or elevated temperature prepared without the use of a solvent; a method in which a powdery matrix resin is fixed to the nonwoven reinforcement; and a method in which a matrix resin layer is formed on a film or sheet having mold releasability and thereafter said layer is transferred to the nonwoven reinforcement. Since the nonwoven reinforcement for a printed wiring base board of the invention is excellent in resin impregnation properties, it is made possible to impregnate the resin into the nonwoven fabric substantially in whole, whereby excellent working effect is assured. In the case where the impregnated or stuck matrix-resin is dried, it is preferable to dry said matrix resin with a vertical dryer under non-contact condition.

A printed wring base board can be produced by using at least one prepreg obtained in the above-mentioned manner, and is specifically exemplified by a printed wiring base board composed of single layer of the prepreg, a printed wiring base board constituted by laminating at least two said prepregs and a printed wiring base board constituted by laminating at least one said prepreg and at least one other material, for example, glass cloth, nonwoven glass fabric, other fabric of fiber, porous base material, plastics sheet, plastics film and plastics plate. In order to effectively assure the effect of the invention, a printed wiring base board is preferably composed only of at least one prepreg constituted by impregnating the resin into the nonwoven reinforcement of the invention, and the printed wiring board is more preferably constituted by laminating two to five of the prepregs from the aspect of mechanical performance, electrical characteristics and handling property of the printed wiring base board to be produced.

A printed wring board is obtained by laminating the above-produced printed wiring base board with at least one metallic layer, which is not restricted to single layer, but may be a plurality of layers.

Examples of the metallic layer include metallic foils, metallic sheets, metallic plates and metallic nets. The metallic layer may be used in combination with at least one other as the case may be, and may be surface-treated. Preferably usable metals for constituting the metallic layer include copper, iron and aluminum, of which copper is particularly preferable. The thickness of the metallic layer is preferably in the range of 10 to 50 $\mu$m from the aspect of handleability and electrical characteristics. The metallic layer may be adhesively bonded to multi-layers with an adhesive as the case may be.

The process for producing the printed wiring board is not specifically limited, but may be selected for use from conventional known processes, for example, a process which comprises laminating one or two prepregs constituted by impregnating the resin into the nonwoven reinforcement of the invention (along with an other nonwoven reinforcement) and at least one metallic layer, and heating pressurizing the resultant laminate to cure and/or solidify the matrix resin and at the same time, to effect interlaminar adhesion, whereby the objective printed wiring board is obtained. The heating temperature and pressure, etc. in the foregoing process may be adopted from appropriate conditions according to the type of the matrix resin, the kinds of materials to be laminated, the number of the layers and the like factors. Needless to say, there is no objection to a method wherein a plurality of prepregs are laminated in advance and thereafter at least one metallic layer is laminated thereon.

From the viewpoint of handleability, it is preferable that the printed wiring board have a thickness in the range of 0.2 to 0.8 mm and a specific gravity of at most 1.5, especially in the range of 0.8 to 1.4. From the viewpoint of electrical characteristics, it is preferable that said board have a dielectric constant of at most 3.3, especially in the range of 2.0 to 3.2 and a dielectric loss tangent of at most 0.0098, especially in the range of 0.0085 to 0.0095.

According to the present invention, it is made possible to produce a nonwoven reinforcement for a printed wiring base board which reinforcement is excellent in various performances such as dimensional stability, mechanical performance, heat resistance, matrix-resin impregnation properties, uniformity, lightweight properties and non-hygroscopicity, and also is excellent in processability at the time of producing a prepreg. The use of the aforesaid nonwoven reinforcement enables the production of a printed wiring board as well as a printed wiring base board that are excellent in various performances such as dimensional stability, heat resistance, hot moisture resistance, uniformity, solder heat resistance, low dielectric constant and low specific gravity.

In the following, the present invention will be described in more detail with reference to comparative examples and working examples, which however shall not limit the present invention thereto. Precedingly, descriptions will be given of the methods for measuring various physical/chemical properties used in the examples.

{Melt Viscosity, Poise}

Melt viscosity in poise was measured at 300° C. at a shear rate of 1000 sec$^{-1}$ by using a capillogragh type 1B produced by Toyo Seiki Co., Ltd.

{Melting Point, ° C.}

Melting point in ° C. is the peak temperature of major heat absorption peak which is observed by differential scanning calorimeter (DSC) according to JIS K 7121 for the thermotropic crystalline polyester sample. Specifically the melting point was obtained by a method in which 10 to 20 mg of a sample placed in an aluminum-made pan was enclosed in a DSC (for example, produced by Mettler Corp. under the trade name "TA-3000"), subsequently a nitrogen carrier gas was passed through the DSC at a flow rate of 100 ml/minute with temperature raising at a rate of 20° C./minute, and the peak temperature of major heat absorption was determined. In the case where distinct heat absorption peak did not appear in said first run depending upon the type of the polymer, there was available an alternative mothod comprising raising the temperature to a temperature higher than the expected one by about 50° C. at a rate of 50° C./minute; completely melting the sample at said temperature for 3 minutes; cooling to 50° C. at a rate of 80° C./minute; and thereafter measuring a heat absorption peak at a temperature raising rate of 20° C./minute.

{Tenacity, g/d}

Tenacity in g/d was obtained by carrying out a tensile break test according to JIS L 1013 by using a tenacity and elongation-testing machine (produced by Shimadzu Corporation under the trade name "DCS-100") for a sample length of 20 cm at an initial load of 0.1 g/d and a tensile rate of 10 cm/min to draw a Stress-Strain Curve, and analyzing the curve thus obtained. The average of five measurements was adopted.

{Modulus of Elasticity, g/d}

Modulus of elasticity in g/d was obtained by carrying out a tensile break test according to JIS L 1013 by using a tenacity and elongation-testing machine (produced by Shimadzu corporation under the trade name "DCS-100") for a sample length of 20 cm at an initial load of 0.1 g/d and a tensile rate of 10 cm/min, and calculating by the following formula using the Stress-Strain Curve thus obtained.

$$\text{Modulus of elasticity} = (w/D)/(\Delta L/L)$$

where, w; load at elongation of $\Delta L$ (g)

D; denier of fiber (d)

$\Delta L$; elongation by load (mm)

L; original length of fiber (mm)

{Fiber Diameter, $\mu m$}

Fiber diameter in $\mu m$ was obtained by taking electron micrographs of sides of fiber at a magnification of 1000 by the use of a scanning electron microscope, measuring fiber diameters at arbitrary 10 points and regarding the arithmetical average of 10 measurements as the objective fiber diameter.

{Number of Holes/mm$^2$, and Average Area of Opening, $\mu m^2$}

The number of holes per 1 mm$^2$ was obtained by taking enlarged photographs of sample surfaces (magnification of about 100, photographing area of at least 0.2 mm$^2$), and measuring the number of holes formed on the film-like binder having an area of opening of 400 to 10000 $\mu m^2$ on said photographs. The average area of opening was obtained from the arithmetical average of the area of opening of 400 to 10000 $\mu m^2$.

The holes formed on the film-like binder as mentioned herein shall clearly be distinguished from the void which is formed in the interspace of principal fiber substantially free from the binder, and the area of opening of a hole shall be the area of the portion that can be judged to be free from principal fiber in a layer lower than the holes.

{Principal Fiber Ratio, % and Hole Formation Ratio, %}

Principal fiber ratio in % was obtained by taking enlarged photographs of the surfaces of the nonwoven reinforcement (magnification of about 100), determining the areal ratio (%) of the portion which was so recognized that principal fiber was present on the surface layer portion of the nonwoven reinforcement. Hole formation ratio in % was obtained as the areal ratio of the holes which were present in the film-like binder and had an area of opening of 400 to 10000 $\mu m^2$.

{Basis Weight (Metsuke), g/m$^2$; Thickness, $\mu m$}

Basis weight (Metsuke) in g/m$^2$ and thickness in $\mu m$ were each obtained according to JIS P-8124 and JIS P-8118.

{Standard Deviation of Basis Weight}

Standard deviation of basis weight was obtained by clipping test pieces in the form of square (50 cm×50 cm) from the nonwoven reinforcement at a position at least 20 cm remote from the end of the nonwoven reinforcement towards inside, cutting the resultant test piece into 100 numbers of small squares (5 cm×5 cm), and measuring the basis weight of each of the small squares to determine the standard deviation. It means that as the standard deviation decreases, the thickness of the nonwoven reinforcement becomes more uniform, and the fiber is more uniformly dispersed.

{Void Fraction, %}

Void fraction in % was obtained by measuring the weight (w; g/m$^2$) and thickness (D; mm) of a sample according to JIS P 8124 and JIS P-8118 and calculating the void fraction by the following formula: $[1-\{W/(D\times 10^3 \times d)\}]\times 100$, wherein d is density of polymer (g/cm$^3$) constituting the nonwoven reinforcement.

{Breaking Length, km}

Breaking length in km was obtained by measuring the respective strengths in the length and breadth directions for a sample (200 mm length×150 mm breadth) according to JIS P8113-1976, dividing the measurements by the basis weight of the sample, and regarding the arithmetical average as the breaking length. Breaking length is mainly an index pointing out the tensile strength. In general, a breaking length of not less than 0.6 km results in good processability for resin impregnation step, etc. and dimensional stability and the like.

{Resin Impregnation Properties}

Resin impregnation properties were evaluated by impregnating a nonwoven reinforcement with a matrix resin liquid (varnish) incorporated with 0.5% by weight of cyanine blue as mentioned hereinafter, drying the reinforcement at 150° C. for 6 minutes to prepare a prepreg, laminating the prepreg with a copper foil having a thickness of 18 $\mu m$, heat pressing the laminate at 180° C. at a linear pressure of 20 kg/cm for 90 minutes, etching the heat pressed product with ferric chloride solution for 10 minutes at room temperature, observing the etched surface, and evaluating defects of a diameter of 0.5 mm or larger. The portion of the etched laminate which was not impregnated with the resin can be confirmed as a defect by white light emitted. Defective product with poor resin impregnation properties, when passed through a soldering step after water absorption in the etching step, causes surface fracture and besides, absorbs water with the lapse of long hours, thus unfavorably contributing to the trouble of deteriorated insulation.

{Dry Thermal Shrinkage (Heat Resistance) %}

Dry thermal shrinkage was evaluated by heat treating a sample (about 10 cm×10 cm) in an oven at 280° C. for 24 hours and at 320° C. for 24 hours and thereafter, evaluating the areal shrinkage ratio, which was calculated by the formula (A−B)/A×100, wherein A is sample area before the heat treatment and B is sample area after the heat treatment.

{Resin Adhesiveness}

Resin adhesiveness was evaluated by visually observing the prepreg after impregnating a nonwoven reinforcement with a matrix resin on the basis of the following criteria:

⊙; Excellent—matrix resin is uniformly thinnly impregnated and stuck to the nonwoven reinforcement.

O: Fair—matrix resin is thinnly impregnated thereto, but includes much cissing.

x: Poor—matrix resin is thickly stuck onto the surface thereof without being impregnated into the inside thereof.

{Solder Heat Resistance}

Solder heat resistance was evaluated by clipping test pieces in the form of square (50 mm×50 mm) from a printed wiring board, removing ¾ of the copper foil by etching, sufficiently washing with water, drying at 120° C. for 1 hour, placing it in boiling water to boil for 2, 4, 6, or 8 hours, taking out from boiling water, heating it in air at 260° C. for 180 seconds, allowing it to cool at room temperatures, visually observing whether or not there was any blister and/or peeling on the copper foil surface, copper foil-removed surface, end surface or laminate surface, and evaluating the results on the basis of the following criteria:

O; good—no blister or peeling x; poor—blister or peeling observed on at least one place The samples that were not boiled in boiling water (boiling hour of zero) were also subjected to heating at 260° C. for 180 seconds in air to evaluate in the same manner as above.

A printed wiring board having poor solder heat resistance, even if being excellent in electrical characteristics in the initial stage, is deteriorated in electrical characteristics by hygroscopicity with the lapse of a long period of time.

{Dielectric Constant, Dielectric Loss Tangent}

Dielectric constant and dielectric loss tangent were measured according to JIS C6481 by the modified bridge method at 250° C.±2° C.

{Specific Gravity}

Specific gravity was measured by completely removing copper foil by etching a printed wiring board, sufficiently washing the board with water, drying it at 120° C. for 2 hours, clipping a test piece in the form of square (25 mm×25 mm) from the board, and measuring the specific gravity according to JIS K 7112.

{Thermotropic Crystalline Polyester Fiber (Component A)}

Thermotropic crystalline polyester raw spun yard having a fiber diameter of 17 μm and a melting point of 280° C. was produced by a process comprising the steps of drying at 140° C. under reduced pressure for 100 hours, thermotropic crystalline polyester which had a molar ratio of the constitutional unit (P) to the constitutional unit (Q) in the foregoing chemical formula 3 of 73/27 and had a melt viscosity of 430 poise, a degree of polymerization of 100 and a melting point of 280° C.; then feeding the dried polymer to a vent-type single screw extruder; filtering it by passing through a filter layer having an average poor size of 5 μm and comprising a sand layer and metallic fiber; spinning out through a spinneret (50 nozzle holes with 0.08 mm diameter) at 320° C.

Subsequently, the resultant raw spun yarn was heat treated at 280 to 300° C. for 17 hours to proceed with solid-phase polymerization and raise the melting point thereof to 320° C. and cut into a fiber length of 5 mm to produce thermotropic crystalline polyester fiber having a tenacity of 25 g/d and a modulus of elasticity of 550 g/d (component A; melting point of 320° C.).

{Thermotropic Crystalline Polyester Fibrous Binder (Component B)}

Thermotropic crystalline polyester raw spun yarn having a fiber diameter of 17 μm, a tenacity of 13 g/d and a modulus of elasticity of 520 g/d (component B; melting point of 280° C.) was produced by a process comprising the steps of drying at 140° C. under reduced pressure for 100 hours, thermotropic crystalline polyester which had a molar ratio of the constitutional unit (P) to the constitutional unit (Q) in the foregoing chemical formula 3 of 73/27 and had a melt viscosity of 430 poise, a degree of polymerization of 100 and a melting point of 280° C.; then feeding the dried polymer to a vent-type single screw extruder; filtering it by passing through a filter layer having an average pore size of 5 μm and comprising a sand layer and metallic fiber; spinning out through a spinneret (50 nozzle holes with 0.08 mm diameter) at 320° C.

Subsequently, the resultant raw spun yarn was cut into a fiber length of 5 mm, then was dispersed in water to produce an aqueous suspension, and was heated with a disc refiner for general purpose use to produce fibrous binder having a fiber diameter of about 1 to 5 μm (CSF 500 ml: component B).

{Matrix Resin (Varnish)}

2, 2-bis(4-cyanatophenyl)propane in an amount of 900 parts by weight and 100 parts by weight of bis (maleidophenyl)methane were preliminarily reacted at 150° C. for 130 minutes, and subsequently the resultant reaction product was dissolved in 60 parts by weight of the mixed solvent of methyl ethyl ketone and N,N-dimethylformamide. To 50 parts by weight of the solution thus obtained were dissolved 70 parts by weight of bisphenol A- epoxy resin (produced by Yuka Shell Epoxy Corporation under the trade name "Epoxete 1001" having an epoxy equivalent of 450 to 500) and 0.02 part by weight of zinc octylate to prepare a matrix resin solution (varnish).

EXAMPLES 1 to 3, COMPARATIVE EXAMPLES 1 & 2

By the use of the foregoing thermotropic crystalline polyester fiber (component A) and thermotropic crystalline polyester fibrous binder (component B) at a ratio by weight as given in Table 1, 0.1% by weight of an aqueous slurry as paper stuff was prepared. The paper stuff thus obtained was subjected to sheet-making process with a circular net Yankee testing paper making machine, dried at 105° C. to prepare a sheet product (raw fabric) having a basis weight of about 50 g/m² and a thickness of about 120 μm.

The resultant raw fabric was heat treated by brining it into contact under non-pressurized condition (0 kg/cm²) with the surface of a steel-made roller at 280 or 250° C. at a linear velocity of 10 m/minute, thereafter again was heat treated in air by allowing it to stand in a hot-air drying furnace at 300° C. for 24 hours, and was subjected to a corona discharge treatment to prepare a nonwoven reinforcement by continuously passing it through a corona discharge treating apparatus (output of 1 kW/m²) at a velocity of 10 m/minute.

Subsequently, the resultant nonwoven reinforcement was impregnated with the matrix resin solution (varnish), dried at 150° C. to prepare prepregs containing 66 to 68% by weight of the resin. Four prepregs thus obtained were superimposed, and both sides thereof were laminated with copper foils having a thickness of 35 μm. The laminate was placed between mirror-finish surfaces of stainless steel, and was subjected to laminate molding step through pressurizing heating treatment for 2 hours under the conditions of a pressure of 40 kg/cm² and a temperature of 200° C. to produce a printed wiring board having a thickness of 0.40 to 0.45 mm. The results are given in Table 1.

EXAMPLE 4

The procedure in Example 2 was repeated except that after the heat treatment in a hot air-drying furnace at 300° C., a low-temperature pressing treatment was carried out under the conditions of a linear pressure of 30 kg/cm by the use of a steel-made heating roller at 80° C. at a linear velocity of 10 m/minute so as to decrease the thicknes of the nonwoven reinforcement, followed by a corona discharge treatment. The results are given in Table 1.

EXAMPLE 5

The procedure in Example 2 was repeated to produce a printed wiring board except that the corona discharge treatment was omitted. The results are given in Table 1.

COMPARATIVE EXAMPLE 3

The procedure in Example 2 was repeated to produce a printed wiring board except that the heat treatment in the hot air-drying furnace was omitted. The results are given in Table 1.

COMPARATIVE EXAMPLE 4

The procedure in Example 2 was repeated to produce a printed wiring board except that the heat treatment condition with the steel roller was altered to a roller surface temperature of 250° C. and to a linear pressure of 80 kg/cm$^2$, and that the heat treatment in the hot air-drying furnace was carried out in an atmosphere of nitrogen gas. The results are given in Table 2.

COMPARATIVE EXAMPLE 5

Thermotropic crystalline polyester fiber before being cut into short fiber (melting point of 320° C.) was made into a bundle having about 100,000 denier. The resultant bundle was mechanically crimpled at 80° C., cut into crimpled fiber having a fiber length of 51 mm, an average diameter of 17 $\mu$m and the number of crimps of 12/inch. By the use of the crimpled fiber, a fibrous web was produced so that the state of orientation in the web was so adjusted that the ratio by weight of the fiber oriented in the direction of the web length to the fiber crossing to the direction of the web length became 1:4.

Subsequently the web was placed on a 80 mesh support, the face side of the web was subjected to water-jet entangling treatment under the conditions including a water-jet nozzle diameter of 0.13 mm, a nozzle pitch of 0.6 mm, an angle to the web of 90 degrees and a water-jet pressure of 80 kg/cm$^2$, the back side of the web was subjected to water-jet entangling treatment in the same manner as above, and the face side thereof was again subjected to the same water-jet entangling treatment to produce a raw fabric. Afterward, the procedure in Example 1 was repeated to produce a printed wiring board except that the raw fabric was subjected to heating pressurizing treatment under the conditions of a linear pressure of 80 kg/cm and a linear velocity of 10 m/minute by the use of a steel-made heating roller at 280° C. The results are given in Table 2.

COMPARATIVE EXAMPLE 6

Thermotropic crystalline polyester fiber before being cut into short fiber (melting point of 320° C.) as the component A in an amount of 90% by weight and 10% by weight of thermotropic crystalline polyester fiber before being beaten (melting point of 280° C.) as the component B were made into a bundle having about 100,000 denier. The resultant bundle was mechanically crimpled at 80° C., cut into crimpled fiber having a fiber length of 51 mm, an average diameter of 17 $\mu$m and the number of crimps of 12/inch. By the use of the crimpled fiber, a fibrous web was produced in the same manner as in Comparative Example 5. The results are given in Table 2.

COMPARATIVE EXAMPLE 7

The procedure in Comparative Example 4 was repeated to produce a printed wiring board except that there were used aramid fiber (produced by Du Pont Co. Ltd. under the trade name "Kepler 49", average fiber diameter of 13 $\mu$m, fiber length of 5 mm) and aramid pulp (produced by Du Pont Co. Ltd. under the trade name "Nomex Pulp", CSF: 200 ml) in place of the thermotropic crystalline polyester fiber (component A) and the thermotropic crystalline polyester fibrous binder (component B). The results are given in Table 2. As for the column of this comparative example in Table 2, A is aramid fiber, and B is aramid pulp.

TABLE 1

| (Comparative)Example No. | Ex-1 | Ex-2 | Ex-3 | Ex-4 | Ex-5 | C.Ex-1 | C.Ex-2 |
|---|---|---|---|---|---|---|---|
| Heat treatment, etc. | | | | | | | |
| Roller temperature, ° C. | 280 | 280 | 280 | 280 | 280 | 280 | 250 |
| Roller linear pressure, kg/cm | 0 | 0 | 0 | 0 | 0 | 0 | 0 |
| Heating furnace temp. ° C. | 300 | 300 | 300 | 300 | 300 | 300 | 300 |
| Heating furnace atmosphere | air | air | air | air | air | air | air |
| Low temp. press treatment | no | no | no | done | no | no | no |
| Corona discharge treatment | done | done | done | done | no | done | done |
| Nonwoven reinforcement | | | | | | | |
| Production of nonwoven fabric | w.s. | w.s. | w.s. | w.s. | w.s. | w.s. | w.s. |
| A/B(ratio by weight) | 50/50 | 30/70 | 80/20 | 30/70 | 30/70 | 95/5 | 0/100 |
| Number of holes, nos./mm$^2$ | 52 | 102 | 21 | 92 | 98 | 0 | 2 |
| Average area of opening $\mu$m$^2$ × 10$^3$ | 2 | 2 | 3 | 2 | 2 | — | 1 |
| Principal fiber ratio, % | 45 | 28 | 65 | 27 | 26 | 82 | 100 |
| Hole formation ratio, % | 13 | 18 | 6 | 11 | 17 | — | 1 |
| Void fraction, % | 65 | 55 | 80 | 50 | 55 | 85 | 30 |
| Thickness, $\mu$m | 104 | 79 | 184 | 71 | 79 | 241 | 51 |
| Basis weight, g/m$^2$ | 51 | 50 | 52 | 50 | 50 | 51 | 50 |
| Standard deviation of basis weight | 0.8 | 0.9 | 0.8 | 0.8 | 0.9 | 0.8 | 0.9 |
| Breaking length, km | 2.2 | 2.1 | 2.2 | 2.5 | 2.1 | 0.5 | 4.5 |
| Resin impregnation properties | 0 | 0 | 0 | 0 | 0 | 1 | 3 |
| Dry thermal shrinkage, % | 1.5 | 1.5 | 1.0 | 1.0 | 2.0 | 2.0 | 2.0 |
| Resin adhesiveness | ⊚ | ⊚ | ⊚ | ⊚ | ○ | ⊚ | ⊚ |
| Performance of printed wiring board | | | | | | | |
| Dielectric constant | 3.1 | 3.1 | 3.1 | 3.1 | 3.1 | 3.1 | 3.1 |
| Dielectric loss tangent, × 10$^{-3}$ | 9.0 | 9.1 | 9.1 | 9.0 | 9.1 | 9.1 | 9.1 |
| Specific gravity | 1.18 | 1.18 | 1.19 | 1.19 | 1.18 | 1.19 | 1.19 |

TABLE 1-continued

| (Comparative)Example No. | | Ex-1 | Ex-2 | Ex-3 | Ex-4 | Ex-5 | C.Ex-1 | C.Ex-2 |
|---|---|---|---|---|---|---|---|---|
| Solder heat resistance | 0 hour boiling | ○ | ○ | ○ | ○ | ○ | ○ | X |
| | 2 hours boiling | ○ | ○ | ○ | ○ | ○ | ○ | X |
| | 4 hours boiling | ○ | ○ | ○ | ○ | ○ | X | X |
| | 6 hours boiling | ○ | ○ | ○ | ○ | X | X | X |
| | 8 hours boiling | ○ | ○ | ○ | ○ | X | X | X |

[Remarks] Ex: Example, C.Ex.: Comparative Example, w.s.: wet-system sheet making process

TABLE 2

| Comparative Example No. | C.Ex-3 | C.Ex-4 | C.Ex-5 | C.Ex-6 | C.Ex-7 |
|---|---|---|---|---|---|
| Heat treatment, etc. | | | | | |
| Roller temperature, °C. | 280 | 280 | 280 | 280 | 280 |
| Roller linear pressure, kg/cm | 0 | 80 | 80 | 80 | 0 |
| Heating furnace temp. °C. | — | 300 | 300 | 300 | 300 |
| Heating furnace atmosphere | — | $N_2$ | air | air | air |
| Low temp. press treatment | no | no | no | no | no |
| Corona discharge treatment | done | done | done | done | done |
| Nonwoven reinforcement | | | | | |
| Production of nonwoven fabric | w.s. | w.s. | sp/la | sp/la | w.s. |
| A/B(ratio by weight) | 30/70 | 30/70 | 100/0 | 90/0 | 50/50 |
| Number of holes, nos./mm² | 88 | 0 | 0 | 0 | 0 |
| Average area of opening $\mu m^2 \times 10^3$ | 2 | — | — | — | — |
| Principal fiber ratio, % | 20 | 30 | 90 | 90 | 45 |
| Hole formation ratio, % | 19 | — | — | — | — |
| Void fraction, % | 55 | 30 | 80 | 60 | 50 |
| Thickness, $\mu m$ | 80 | 51 | 177 | 90 | 72 |
| Basis weight, g/m² | 51 | 50 | 52 | 50 | 50 |
| Standard deviation of basis weight | 0.9 | 0.8 | 5.1 | 5.5 | 0.9 |
| Breaking length, km | 1.5 | 5.0 | 2.1 | 3.2 | 1.7 |
| Resin impregnation properties | 1 | 8 | 8 | 5 | 1 |
| Dry thermal shrinkage, % | 11.0 | 1.0 | 1.5 | 1.5 | 1.5 |
| Resin adhesiveness | ○ | ○ | ⊙ | ⊙ | ⊙ |
| Performance of printed wiring board | | | | | |
| Dielectric constant | 3.1 | 3.0 | 3.4 | 3.4 | 4.0 |
| Dielectric loss tangent, × $10^{-3}$ | 9.0 | 9.2 | 10.0 | 10.0 | 12.0 |
| Specific gravity | 1.17 | 1.18 | 1.18 | 1.18 | 1.19 |
| Solder heat resistance  0 hour boiling | ○ | ○ | ○ | ○ | ○ |
| 2 hours boiling | ○ | X | ○ | ○ | X |
| 4 hours boiling | X | X | X | X | X |
| 6 hours boiling | X | X | X | X | X |
| 8 hours boiling | X | X | X | X | X |

[Remarks] C. Ex: Comparative Example, w.s.: wet-system sheet making process, sp/la: spun lace process The following is the summary of the results of the examples and comparative examples described hereinbefore:

The nonwoven reinforcement for a printed wiring base board according to the invention is enhanced in resin impregnation properties, heat resistance and uniformity has sufficient strength (breaking length) and is excellent in processability at the time of producing a printed wiring base board. The printed wiring board which is obtained by using the nonwoven reinforcement has favorably low dielectric constant and specific gravity, and is excellent in uniformity, heat resistance and also solder heat resistance. In particular, a printed wiring board which is subjected to corona discharge treatment is improved in resin adhesiveness to a matrix resin and in solder heat resistance.

A nonwoven reinforcement having a low blending ratio of the binder component (component B) fails to form film-like binder and has inferior mechanical performance, since it is impossible to firmly bond the principal fiber and the interspace. Conversely, a nonwoven reinforcement not incorporated with the principal fiber (component A) makes it impossible to form prescribed holes in the binder and also to maintain its original configuration, thus deteriorating resin impregnation properties and mechanical characteristics, since the binder is melted and shrinked at the time of sheet-making.

A nonwoven reinforcement which is subjected to heat pressing treatment (Comparative Example 4) results in failure to form prescribed holes on the surface of the nonwoven reinforcement, deteriorates resin impregnation properties and solder heat resistance and, in spite of its favorable initial electrical characteristics, makes it impossible to maintain such characteristics over a long period of time.

On the other hand, in spite of the use of thermotropic crystalline polyester fiber, a nonwoven reinforcement which comprises as a raw fabric, nonwoven fabric produced by water-jet entangling method (spun lace method) instead of by wet-system sheet-making process, not only suffers such defects as large standard deviation of the basis weight (Mitsuke), marked unevenness in thickness, ununiform characteristics in each portion of the sheet formed and deteriorated electrical characteristics, but also raises unfavorable problems in processability because of excessive elongation due to a low modulus of elasticity. Even if the components A and B are used in combination (Comparative Example 6), the resultant printed wiring board is devoid of dense structure inherent in the wet-system nonwoven fabric of the invention and accordingly, the binder thus produced fails to form a film and is inferior in uniformity, though the contact portion between the fiber and fibrous binder is bonded.

The use of aramid fiber (Comparative Example 7) brings about high hygroscopicity of the resultant fiber with the result that a printed wiring board produced therefrom is inferior not only in solder heat resistance after forced humidification but also in electrical characteristics such as dielecrric constant and dielectric loss tangent.

What is claimed is:

1. A process for producing a nonwoven reinforcement for a printed wiring base board which comprises: producing by wet system paper making, paper stuff comprising (A) a thermotropic crystalline polyester fiber having a melting point 290° C. or higher and (B) a thermotropic crystalline polyester fibrous binder having a melting point lower than 290° C.; heat treating the resultant paper stuff under a non-pressurizing condition to melt and bring the thermotropic crystalline polyester fibrous binder into a form of a film having holes including at least 5 holes/mm$^2$ each with an area of opening of 400 to 10000 $\mu$m$^2$ and to fix the thermotropic crystalline polyester fiber; and subjecting the thermotropic crystalline polyester fibrous binder to solid-phase polymerization to bring the melting point thereof to 290° C. or higher.

2. A nonwoven reinforcement for a printed wiring base board which nonwoven reinforcement comprises a wet system nonwoven fabric constituted of (A) a thermotropic crystalline polyester fiber having a melting point of 290° C. or higher and (B) a thermotropic crystalline polyester binder which has a melting point of 290° C. or higher and is in the form of a film having holes including at least 5 holes/mm$^2$ each with an area of opening of 400 to 10000 $\mu$m$^2$, said thermotropic crystalline polyester fiber being fixed by said thermotropic crystalline polyester binding.

3. The nonwoven reinforcement for a printed wiring base board according to claim 2, wherein the ratio by weight of said thermotropic crystalline polyester fiber to said thermotropic crystalline polyester binder is in the range of 20:80 to 90:10.

4. The nonwoven reinforcement for a printed wiring base board according to claim 2 or 3, wherein the void fraction in said nonwoven reinforcement is at least 40% and the breaking length thereof is at least 0.6 km.

5. The nonwoven reinforcement for a printed wiring base board according to claim 4, wherein the Metsuke (basis weight) of said nonwoven reinforcement is in the range of 20 to 100 g/m$^2$.

6. The nonwoven reinforcement for a printed wiring base board according to claim 2, wherein the Metsuke (basis weight) of said nonwoven reinforcement is in the range of 20 to 100 g/m$^2$.

7. A printed wiring base board comprising at least one prepreg which is formed by impregnating or adhesively bonding the wet system nonwoven fabric as set forth in claim 2 or 3 with a thermoplastic resin or a thermosetting resin.

8. A printed wiring board which comprises at least one printed wiring base board according to claim 7.

9. A printed wiring board which comprises at least one printed wiring base board according to claim 7 and at least one copper layer that are laminated with one another.

* * * * *